United States Patent [19]

Ozawa et al.

[11] Patent Number: 5,508,619
[45] Date of Patent: Apr. 16, 1996

[54] SYSTEM FOR DISCRIMINATING KINDS OF SURGES ON POWER TRANSMISSION LINES

[75] Inventors: Masaaki Ozawa, Sendai; Sakari Ohira, Hoya, both of Japan

[73] Assignees: Kyokuto Boeki Kaisha, Tokyo, Japan; Tohoku Electric Power Co. Inc., Sendai, Japan

[21] Appl. No.: 324,507

[22] Filed: Oct. 18, 1994

[30] Foreign Application Priority Data

Oct. 19, 1993 [JP] Japan .................. 5-261230

[51] Int. Cl.⁶ ..................... G01R 31/08; H04B 17/00
[52] U.S. Cl. ............... 324/535; 324/532; 324/72; 455/67.1
[58] Field of Search ................ 324/532, 535, 324/539, 72; 455/67.1, 67.3, 12.1; 342/26, 460; 364/420

[56] References Cited

U.S. PATENT DOCUMENTS

| | | | |
|---|---|---|---|
| 2,717,992 | 9/1955 | Weintraub | 324/535 X |
| 3,710,239 | 1/1973 | Nakamura | 324/535 X |
| 4,198,599 | 4/1980 | Krider et al. | 324/72 |
| 4,996,473 | 2/1991 | Markson et al. | 324/72 |
| 5,070,537 | 12/1991 | Ohira et al. | 455/67.1 |
| 5,138,265 | 8/1992 | Kawamura et al. | 324/535 |

FOREIGN PATENT DOCUMENTS

| | | |
|---|---|---|
| 56-63274 | 5/1981 | Japan . |
| 63-206668 | 8/1988 | Japan . |

*Primary Examiner*—Kenneth A. Wieder
*Assistant Examiner*—Diep Do
*Attorney, Agent, or Firm*—Cushman, Darby & Cushman

[57] ABSTRACT

There is disclosed a surge discriminating and locating system having at least one master station and at least one slave station. The system comprises surge receiving means for receiving surges which occur on a power transmission line, locating means for locating a point where the surge occurs, digitizing means for digitizing said surge into a digital signal, extraction means for extracting from said digital signal the characterized portions thereof as information representative of the surge waveform, memory means for storing predetermined reference information concerning the nature of surges, and discriminating means for comparing said information representative of the surge wave form with said reference information stored in said memory means to discriminate the kind of surge.

15 Claims, 3 Drawing Sheets

SYSTEM FOR DISCRIMINATING KINDS OF SURGES ON POWER TRANSMISSION LINES

FIELD OF THE INVENTION

The present invention relates to a surge discriminating and locating system for detecting the characteristics of the waveform of a surge occurring on a power transmission line to determine whether the surge is due to lightning flashover, including back flashover and direct strike, to inductive strike, or AC fault, including grounding and short circuit, so as to locate not only the point where the fault occurred but also the point where the inductive strike occurred and to discriminate the characteristics thereof.

DESCRIPTION OF BACKGROUND ART

There is known a power transmission line fault locating system of the surge-receiving type wherein a master station and a slave station merely independently receive surges and one or the other calculates the difference between the surge receiving times based on a synchronization signal via a communication network of a grounding system so as to locate the point where the surge occurred. However this system can only locate the point where the surge occurred and can not discriminate what kind of surge occurred.

In this conventional system, the kind of fault is detected by a protective relay provided in the substation separately from the fault locating system. Information based on the detection by the protective relay is displayed by a display unit near the protective relay in the substation or is transferred via the communication network to the sites where the information is required.

In many cases, however, the sites are provided with the information, they require by a phone call from a person at the substation or the like. As a result, the sites often do not receive the information promptly, which is likely to delay the start of the restoration work.

Furthermore, the protective relay must be of large capacity and is subject to extremely large loads. What is more, it can not detect inductive strikes.

SUMMARY OF THE INVENTION

It is therefore an object of the present invention to provide a surge discriminating system for discriminating the kind of surge, including those due to the occurrence of a fault and the occurrence of an inductive strike.

It is another object of the present invention to provide a surge discriminating and locating system capable not only of discriminating the kind of surge, including those due to the occurrence of a fault and the occurrence of an inductive strike, but also of locating the point where the fault or inductive strike occurred.

The above and other objects of the present invention can be accomplished by a surge discriminating and locating system having at least one master station and at least one slave station, comprises surge receiving means for receiving surges which occur on a power transmission line, locating means for locating a point where the surge occurs, digitizing means for digitizing said surge into a digital signal, extraction means for extracting from said digital signal the characterized portions thereof as information representative of the surge wave form, memory means for storing predetermined reference information concerning surge characteristics, and discriminating means for comparing said information representative of the surge wave form with said reference information stored in said memory means to discriminate the kind of surge.

In a preferred aspect of the present invention, at least one of said master station and said slave station comprises display means for providing a display based on said digital signal.

In another preferred aspect of the invention, said one of said master station and said slave station further comprises second memory means for storing said digital signal.

In a further preferred aspect of the invention, said extracting means is configured to extract from said digital signal a peak value of the surge as said information representative of said surge waveform.

In a still further preferred aspect of the invention, said extracting means is configured to extract from said digital signal a rise time of the surge as said information representative of said surge waveform.

In another preferred aspect of the invention, said extracting means is configured to extract from said digital signal information on the existence of a prestrike as said information representative of said surge waveform.

In a further preferred aspect of the invention, said locating means includes a GPS receiver for receiving radio waves from a space satellite to provide periodic pulses and reset signals in accordance with said radio waves, counter means which is periodically reset by said reset signals, and converts said periodic pulses into a binary code signal to determine a time when the surge arrived at the station concerned in accordance with an output of said surge receiving means, wherein said slave station further comprises transmitting means for transmitting a value of said counter means to said master station, and wherein said master station further comprises receiving means for receiving said value of said transmitting means of said slave station, and is adapted to compare said value transmitted from said slave station with said value from said counter means of said master station to locate the point where the surge occurred.

In an alternative preferred aspect of the invention, a surge discriminating system comprises, surge receiving means for receiving surges which occur on a power transmission line, digitizing means for digitizing a surge into digital signals, extraction means for extracting from said digital signals the characterized portions thereof as information representative of the surge waveform, memory means for storing predetermined reference information concerning surge characteristics, and discriminating means for comparing said information representative of said surge waveform with said reference information stored in said memory means to discriminate the kind of surge.

The above and other objects and features of the present invention will become apparent from the following description made with the reference to the accompanying drawings.

DESCRIPTION OF THE PREFERRED EMBODIMENTS

Figure 1:
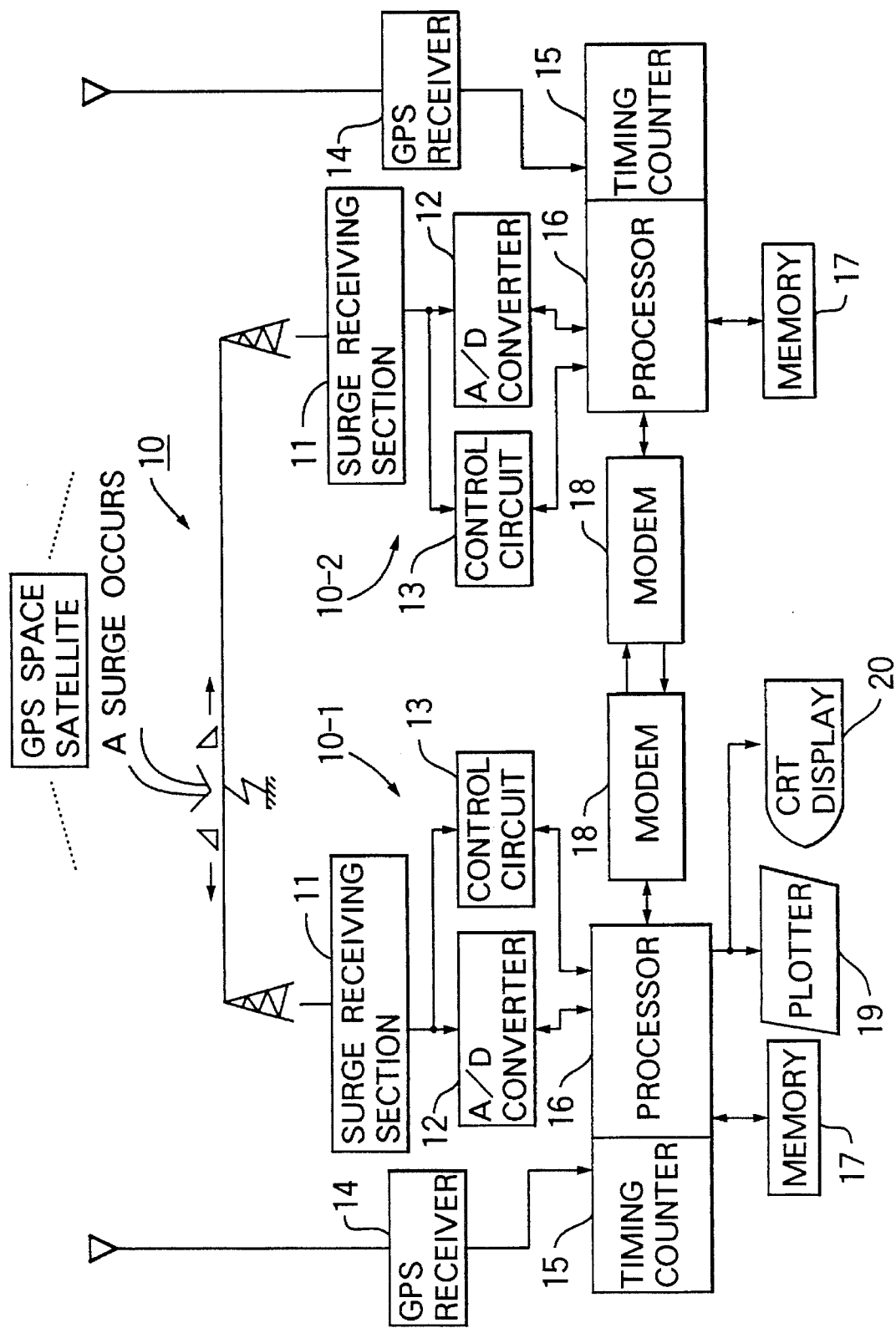
FIG. 1 is a schematic block diagram of a surge discriminating and locating system which is an embodiment of the present invention.

As shown in FIG. 1, a surge discriminating and locating system which is an embodiment of the present invention comprises a master station 10-1 and a slave station 10-2. The master station 10-1 comprises a surge receiving section 11 for receiving high-voltage surge signals transmitted along a power transmission line and transforming each surge signal into a signal of a level receivable by a low-voltage circuit, e.g. a transistor-transistor logic (TTL) circuit, an analog-to-digital (A/D) converter 12 for sampling the signal of the predetermined level transformed by the surge receiving section 11 at a high speed and for digitizing it into a digital signal for delivering to a processor 16, a control circuit 13 for setting a trigger level and for controlling a triggering timing or the like, a GPS receiver 14 for receiving information from a global positioning system (GPS) space satellite to supply to a timing counter 15 periodic pulses at intervals of 10 μsec to 100 μsec, namely, pulses of 100 MHz to 10 MHz and reset signals at intervals of 1 second, the timing counter 15 which is adapted to be reset by the reset signals from the GPS receiver 14 and to transform the periodic pulses of 100 MHz to 10 MHz into digital signals such as binary codes, the processor 16 for comparing the signals transformed by the timing counter 15 of the master station 10-1 and the slave station 10-2 into digital values to determine the distance from the master station 10-1 to the point on the power transmission line where the surge occurred, for discriminating the nature of the surge based on the digital signal from the A/D converter 12, and for delivering the result of the discrimination to output devices, a memory 17 for storing the digital signal from the A/D converter 12 and the digital signal from the timing counter 15 in accordance with the control by the processor 16, and a modem 18 which functions as a data receiver for receiving data from a modem 18 of the slave station 10-2. The output devices include a digital plotter 19, a CRT display 20, and the like for reproducing the waveform of the surge and for outputting the distance from the master station 10-1 to the point where the surge occurred. The memory 17 of the master station 10-1 further stores reference information concerning the nature of surges in a predetermined area thereof in advance.

Similarly, the slave station 10-2 comprises a surge receiving section 11, an A/D converter 12, a control circuit 13, a GPS receiver 14, a timing counter 15, a processor 16, a memory 17, and a modem 18. The modem 18 of the slave station 10-2 functions as a data transmitter for transmitting data to the modem 18 of the master station 10-1.

The operation of the thus constituted surge discriminating and locating system which is an embodiment of the present invention will now be explained.

When a surge occurs on the power transmission line, it is received by the surge receiving section 11 and is transformed into a signal of predetermined voltage level. The signal of the predetermined voltage level is delivered to the control circuit 13 and compared with a predetermined signal of a threshold level. If the level of the signal is over the threshold level, a surge detection signal is delivered to the processor 16. The signal of the predetermined level are is also delivered to the A/D converter 12 to be converted into a digital signal. In accordance with the control by the processor 16, the digital signal is stored in the predetermined area of the memory 17.

In accordance with the detection signal from the control circuit 13, the processor 16 determines the time when the surge arrived at the station 10-1 or 10-2. This is accomplished by use of the timing counter 15 which operates in synchronism with the information received by the GPS receiver 14 from the GPS space satellite. Namely, the processor 16 reads out the value of the timing counter 15 when it receives the surge detecting signal from the control circuit 13, and temporarily stores the value of the timing counter 15 in the memory 17. Then, the processor 16 of the slave station 10-2 transmits the value similarly stored temporarily in its memory 17 via the modem 18. The processor 16 of the master station 10-1 calculates the difference between the counter value when the surge arrived at the master station 10-1 and that when it arrived at the slave station 10-2. In accordance with the difference, it is possible to accurately locate the point where the surge occurred. This method is disclosed by the U.S. Pat. No. 5,070,537, which is incorporated herein by reference.

The process for discriminating the nature of the surge based on the digital signal representing the surge output by the A/D converter 12 will be explained.

The experimentally determined general characteristics of the peak value, waveform and the like of different types of surges are shown in Table 1.

TABLE 1

| KIND OF SURGE | | PEAK VALUE | RISE TIME | HALF LENGTH OF THE FALLING EDGE | PRESTRIKE |
|---|---|---|---|---|---|
| A | BACK FLASH-OVER OR STRIKE FLASHOVER | 500KV to 1500KV (50% F.O.V) | 1 μsec to 10 μsec | 10 μsec to 100 μsec | YES |
|  | INDUCTIVE STRIKE | 100KV to 200KV MAX[1] | OVER 10 μsec | 50 μsec to 100 μsec | YES |
| B | GROUNDING | 0.82 × SV (50KV to 200KV) | 0.5 μsec to 1 μsec | 5 μsec to 10 μsec | NO |
|  | SHORT CIRCUIT | 0.7 × SV (40KV to 200KV) | 0.5 μsec to 1 μsec | 5 μsec to 10 μsec | NO |

A : SURGES DUE TO LIGHTNING
B : SURGES DUE TO AC FAULT
SV: SYSTEM VOLTAGE
MAX[1]: MAXIMUM VALUE XAY BE A FEW HUNDRED KV

As shown in Table 1, each kind of surge is characterized by its peak value, rise time and the like. Accordingly, the present invention discriminates the kind of surge by extracting such characteristics from the surge.

More particularly, the processor 16 of the master station 10-1 extracts from the digital signal output by the A/D converter 12 the characterized portions thereof as data characteristic of the surge waveform. In this embodiment, as the data characteristic of the surge waveform, the processor 16 extracts the peak value, rise time, and information indicating whether or not prestrike is present. The peak value is the magnitude between minimum value and maximum value of the surge. The processor 16 calculates the difference between the minimum and maximum values of the digital signal and converts it into the real peak value. The rise time is the time during which the value of the surge increases from 10% to 90% of the maximum value. Prestrike refers to slight variations in voltage before the surge pulse occurs.

Next, the processor 16 compares the data characteristic of the surge waveform and the reference data characteristic of surge waveforms stored in the memory 17 in advance to discriminate the kind of surge in accordance with logic for the discrimination. In this preferred embodiment, the reference data characteristic of the surge waveforms include reference data representative of the peak value, and of the rise time, and the data indicating whether or not prestrike is present. The reference data representative of the peak value and those representative of the rise time are appropriately determined in advance based on the characteristics of the surges shown in Table 1, and in due consideration of the loads of various electric circuits connected to the power transmission line.

Figure 2:
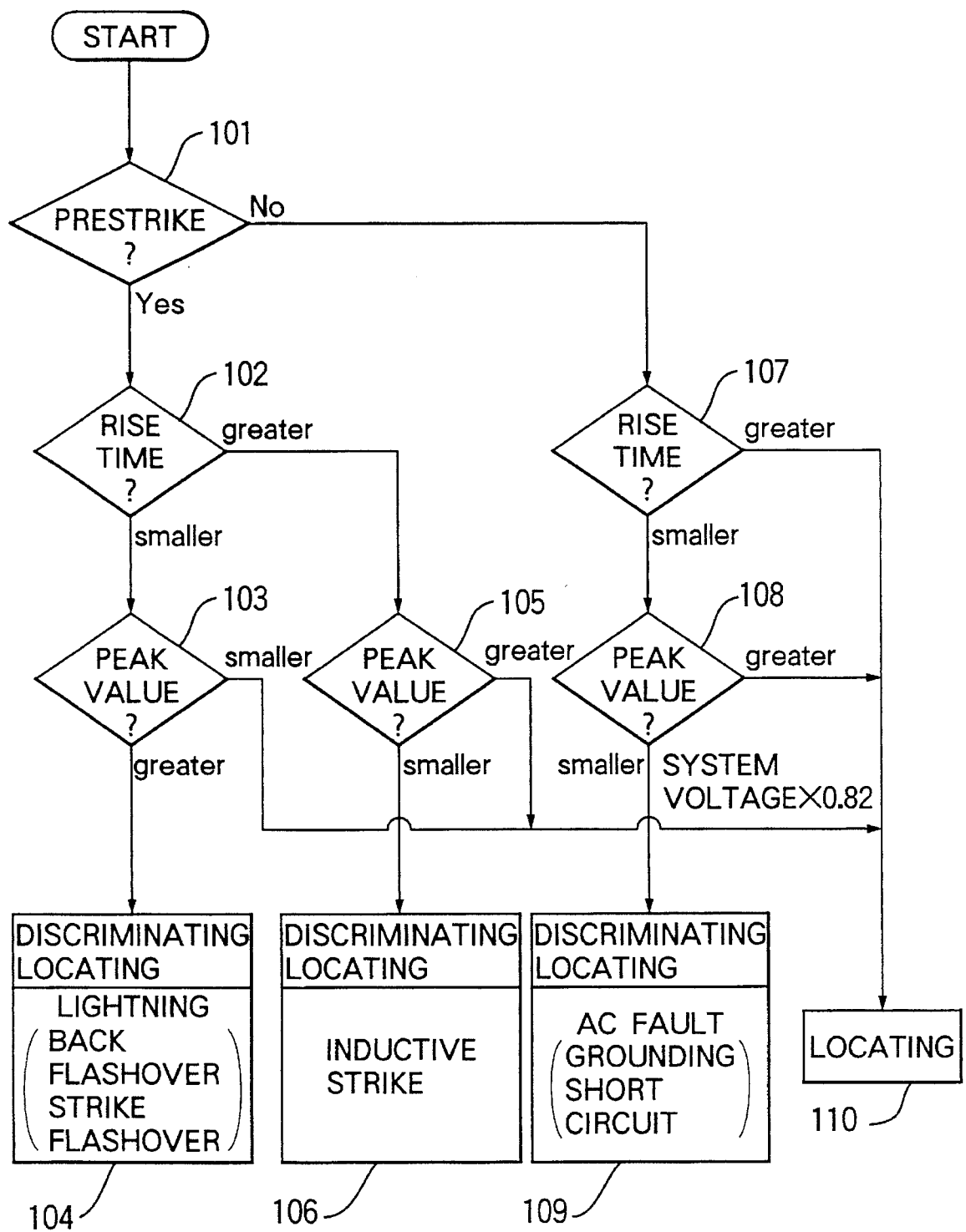
FIG. 2 is a flow chart showing the process for discriminating the kind of surge in an embodiment of the present invention

FIG. 2 is a flow chart showing the process for discriminating the kind of surge in accordance with one embodiment of the present invention.

In accordance with this process, the processor 16 reads out the data characteristic of the surge waveform from the memory 17 to determine whether or not prestrike is present (step 101), because the determination of the presence of prestrike enables surge due to lightning to be discriminated from that due to AC fault.

If prestrike is present, the data representative of the rise time of the data characteristic of the surge waveform is compared with the reference data representative of the rise time stored in memory 17 in advance (step 102). If the former is less than the latter, then the data representative of the peak value is compared with the reference data representative of the peak value (step 103). If the former is greater than the latter, the surge is determined to be a surge due to lightning such as back flashover or strike flashover (step 104). After the determination, the processor 16 conducts the processing for locating the point where the surge occurred (step 104). Then, the processor 16 delivers the data representative of the kind of surge and the point where the surge occurred to output devices such as the plotter 19 and the CRT display 20.

On the contrary, if the data representative of the peak value is less than the reference data in the step 103, the processor 16 does not discriminate the kind of surge, but only locates the point where the surge occurred (step 110). After locating the point, the processor 16 delivers the data representative of the point where the surge occurred to the output devices.

If the data representative of the rise time is greater than the reference data representative of the rise time in the step 102, the data representative of the peak value is then compared with the reference data representative thereof (step 105). If the former is less than the latter, the surge is determined to be a surge due to inductive strike (step 106). After the determination, the processor 16 locates the point where the surge occurred (step 106). Then, the processor 16 delivers the data representative of the kind of surge and the point where the surge occurred to the output devices.

On the contrary, if the data representative of the rise time is greater than the reference data in the step 105, the processor 16 does not discriminate the kind of surge but only locates the point where the surge occurred (step 110). After locating the point, it delivers the data representative of the point where the surge occurred to the output devices.

If the processor 16 determines that prestrike is not present in the step 101, the data representative of the rise time is compared with the reference data representative of the rise time (step 107). As shown in Table 1, it is experimentally known that if a surge is an AC fault surge and is due to a short circuit, it has a peak value of approximately 0.7 times the system voltage. On the other hand, it is experimentally known that a surge due to grounding has a peak value of approximately 0.82 times the system voltage. In this embodiment, since the system is arranged such that AC fault surges can be discriminated even if not by kind, the data representative of the peak value is compared with the data representative of the value of 0.82 times the system voltage (step 108). In the step 108, if the former is less than the latter, the surge is determined to be an AC fault surge (step 109). After the determination, the processor 16 locates the point where the surge occurred (step 109). Then, the processor 16 delivers the data representative of the kind of surge and the point where the surge occurred to the output devices.

On the contrary, if the data representative of the rise time is greater than the reference data in the step 107, or the data representative of the peak value is greater than the data representative of the value of 0.82 times the system voltage in the step 108, the processor 16 does not discriminate the kind of surge. In this case, the processor 16 operates to only locate the point where the surge occurred (step 110), and delivers the data representative of the point where the surge occurred to the output devices.

The basic logic used to discriminate the kind of surge in this embodiment is shown in Table 2. In Table 2, the states corresponding to areas with horizontal lines do not agree with the states of the kind of surge on the basis of experimentally obtained data. However, these states are theoretically possible and the point of occurrence of such surges can be located should they occur.

TABLE 2

| STATE | KIND OF SURGE |
|---|---|
| A · B · C | SURGE DUE TO LIGHTNING |
| A · B · ˇC | — |
| A · ˇB · C | — |
| A · ˇB · ˇC | SURGE DUE TO INDUCTIVE STRIKE |
| ˇA · B · C | — |
| ˇA · B · ˇC | SURGE DUE TO AC FAULT |
| ˇA · ˇB · C | — |
| ˇA · ˇB · ˇC | NOT APPLIED |

A: PRESTRIKE PRESENT
ˇA: PRESTRIKE NOT PRESENT
B: RISE TIME IS SMALLER
ˇB: RISE TIME IS GREATER (IN COMPARISON WITH THE REFERENCE DATA)
C: PEAK VALUE IS GREATER
ˇC: PEAK VALUE IS SMALLER (IN COMPARISON WITH THE REFERENCE DATA)

Figure 3:
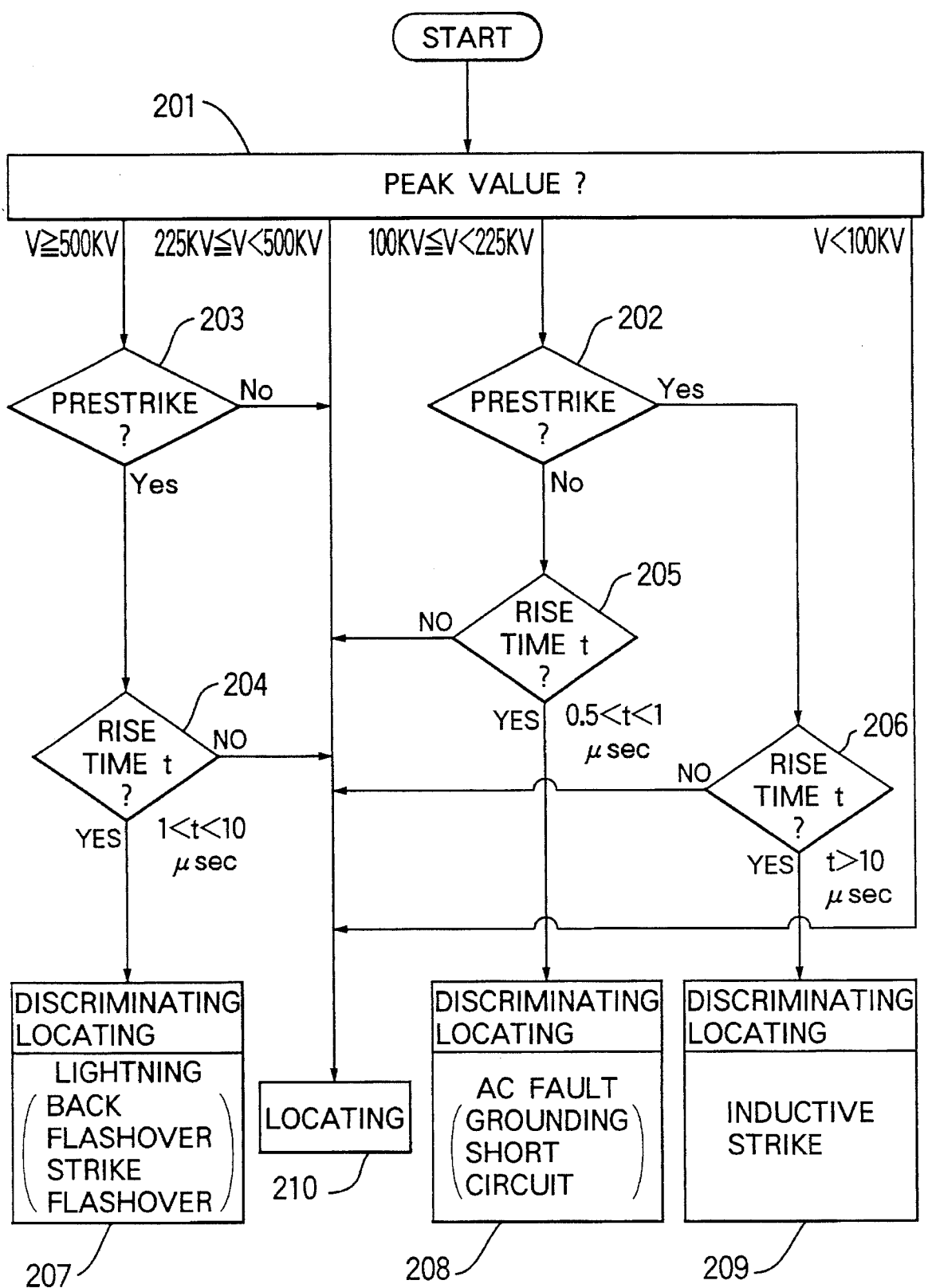
FIG. 3 is a flow chart showing the process for discriminating the kind of surge in another embodiment of the present invention.

The process for discriminating the nature of a surge in accordance with another embodiment of the present invention in which the system voltage is 275 KV will now be explained. FIG. 3 is a flow chart showing the process for discriminating the kind of surge in accordance with another preferred embodiment.

When the system voltage being 275 KV, the peak value of a surge due to grounding is approximately 0.82×275 (KV)= 225 KV at the point where the surge occurs, while that of a surge due to short circuit is approximately 0.7×275 (KV)= 192 V at the same point. Consequently, in this embodiment, the voltage corresponding to the peak value is classified into four bands, namely a first band equal to or greater than 500 KV, a second band equal to or greater than 225 KV and less than 500 KV, a third band equal to or greater than 100 KV and less than 225 KV, and a fourth band less than 100 KV, and the processor 16 determines which band the peak value of the surge falls in (step 201).

If the peak value falls in the third band or the first band, the processor 16 determines whether or not prestrike is present (step 202 or 203). If the processor 16 determines that prestrike is present in the step 203, then it determines whether or not the rise time t of the surge is greater than 1 µsec and is less than 10 µsec (step 204). If the processor 16 determines that prestrike is present in the step 202, then it determines whether or not the rise time t is greater than 10 µsec (step 206). On the other hand, if the processor 16 determines that prestrike is not present in the step 202, it then determines whether or not the rise time t is greater than 0.5 µsec and less than 1 µsec (step 205).

As a result of the above mentioned steps, the surge is discriminated to be a surge due to the lightning (step 207), discriminated to be an AC fault surge (step 208), or discriminated to be a surge due to the inductive strike (step 209). In each of these steps 207 to 209, the point where the surge occurred is located. Furthermore, although based on experience, it seems impossible for the process not to lead to one of the steps 207 to 209, other states can theoretically exist and if one should occur, the processor 16 can locate the point where the surge occurred (step 210).

In this embodiment, as previously mentioned, the bands of the peak value and the ranges of the rise time are used as the reference data characteristic of the surge wave forms. The data used in this embodiment are set to correspond to the values at the sending end of the power transmission line. The data may vary in value in accordance with the characteristics of the devices for receiving the surge from a bus, which is located in the power station yard of the power transmission station, the effect of other power transmission lines, or the like. Consequently, it should be understood that these values can be set so as to match the actual conditions.

As mentioned above, according to these embodiments, the master station or the slave station converts the surges into a digital signal to extract the characteristic data therefrom, and compares the characteristic data with the reference data so as to discriminate the kind of surge. Furthermore the master station can locate the point where the surge occurred. Consequently, it is possible not only to rapidly discriminate the kind of fault on the power transmission line and to locate the fault point but also to discriminate a surge due to the inductive strike and to locate the point where the inductive strike occurred. The fact that an inductive strike can be discriminated by using the power transmission line as a sensor in this way enables the thus obtained result of discrimination to be used for a lightning forecast system and warning system.

Furthermore, since the surge wave converted into a digital signal is stored in the memory, the surge waveform can be displayed on the CRT display 19 or the like at any desired time.

The present invention has thus been shown and described with reference to specific embodiments. However, it should be noted that the present invention in no way limited to the details of the described arrangements but changes and modifications may be made without departing from the scope of the appended claims.

For example, in the above described embodiments, the system are arranged to both discriminate the kind of surge and locate the point where the surge occurred. However it is apparent that the system may be arranged only to discriminate the kind of surge.

Further, in the above described embodiments, each of the master station and the slave station determines the time when the surge arrives thereto based on the information from the GPS space satellite, and the point where the surge occurred is located in accordance with the difference between the above mentioned times. However, it is possible to use a power line carrier return method generally called as a B-type or to use a microwave radio carrier return method generally called as a micro B-type to locate the point where the surge occurred.

Furthermore, although in the above described embodiments, the peak value, the rise time, and the information indicating whether or not prestrike is present are used as the data characteristics of the surge waveform, other information such as information indicating whether or not the polarity of the surge is present, a half length of the falling time, or the like can be used as the data characteristic thereof.

Moreover, it is apparent that algorithms and parameters which can be used in the present invention are not limited to those described in the above described embodiments.

Further, in the present invention, the respective means need not necessarily be physical means and arrangements whereby the function of the respective means is accomplished by software fall within the scope of the present invention. In addition, the function of a single means may be accomplished by two or more physical means and the functions of two or more means may be accomplished by a single physical means.

We claim:

1. A system for discriminating a kind of a surge on a power transmission line and for locating a place on the power transmission line where the surge occurred, said system having at least one master station and at least one slave station, each of said master and slave stations being connected to said power transmission line and being located at one or more ends of said power transmission line, and each of said stations including receiving means for receiving surges which occur on the power transmission line, said master station further comprising:

calculation means for calculating a time difference between a first time when the surge was received by said receiving means of said master station and a second time when the surge was received by said receiving means of said slave station, and locating means for locating a place on the power transmission line where the surge occurred based upon said time difference, and one of said stations comprising:

an analog-to-digital converter for digitizing into a digital signal said surge received by said surge receiving means of said one station;

extraction means for extracting from said digital signal obtained by said analog-to-digital converter information representative of the surge waveform;

memory means for storing predetermined reference information concerning the nature of surges; and discriminating means for comparing said information representative of the surge waveform obtained by said extraction means with said reference information stored in said memory means to discriminate the kind of surge.

2. A surge discriminating and locating system in accordance with claim 1, wherein at least one of said master station and said slave station comprises display means for providing a display based on said digital signal.

3. A surge discriminating and locating system in accordance with claim 2, wherein said one of said master station and said slave station comprises second memory means for storing said digital signal.

4. A surge discriminating and locating system in accordance with claim 1, wherein said extraction means is configured to extract from said digital signal a peak value of the surge as said information representative of said surge waveform.

5. A surge discriminating and locating system in accordance with claim 1, wherein said extraction means is configured to extract from said digital signal a rise time of the surge as said information representative of said surge waveform.

6. A surge discriminating and locating system in accordance with claim 1, wherein said extraction means is configured to extract from said digital signal information of the existence of a prestrike as said information representative of said surge waveform.

7. A surge discriminating and locating system in accordance with claim 1, wherein said extraction means is configured to extract from said digital signal at least one of a peak value of the surge, a rise time of the surge, and information of the existence of a prestrike as said information representative of said surge waveform.

8. A surge discriminating and locating system in accordance with any one of claims 1, said locating means including a global positioning system receiver for receiving radio waves from a space satellite to provide periodic pulses and reset signals in accordance with said radio waves, counter means which is periodically reset by said reset signals, and converts said periodic pulses into a binary code signal to determine a time when the surge arrives at the station concerned in accordance with an output of said surge receiving means, wherein said slave station further comprises transmitting means for transmitting a value of said counter means to said master station, and wherein said master station further comprises receiving means for receiving said value of said transmitting means of said slave station, and is arranged to compare said value transmitted from said slave station with said value from said counter means of said master station to locate the point where the surge occurred.

9. A system for determining a kind of a surge occurring on a power transmission line, the system comprising:

surge receiving means for receiving a surge on the power transmission line;

an analog-to-digital converter for digitizing said surge received by said surge receiving means into a digital signal;

extraction means for extracting portions from said digital signal obtained by said analog-to-digital converter as information representative of the surge waveform;

memory means for storing predetermined reference information concerning the nature of surges; and discriminating means for comparing said information representative of the surge waveform obtained by said extraction means with said reference information stored in said memory means to discriminate the kind of the surge.

10. A surge discriminating system in accordance with claim 9, further comprising display means for providing a display based on said digital signal.

11. A surge discriminating system in accordance with claim 10, further comprising second memory means for storing said digital data.

12. A surge discriminating system in accordance with claim 9, wherein said extraction means is configured to extract from said digital signal a peak value of the surge as said information representative of said surge waveform.

13. A surge discriminating system in accordance with claim 9, wherein said extraction means is configured to extract from said digital signal a rise time of the surge as said information representative of said surge waveform.

14. A surge discriminating system in accordance with claim 9, wherein said extraction means is configured to extract from said digital signal information of existence of a prestrike as said information representative of said surge waveform.

15. A surge discriminating system in accordance with claim 9, wherein said extraction means is configured to extract from said digital signal at least one of a peak value of the surge, a rise time of the surge, information of existence of a prestrike as said information representative of said surge waveform.

* * * * *

UNITED STATES PATENT AND TRADEMARK OFFICE
CERTIFICATE OF CORRECTION

PATENT NO. : 5,508,619

DATED : April 16, 1996

INVENTOR(S) : OZAWA et al

It is certified that error appears in the above-indentified patent and that said Letters Patent is hereby corrected as shown below:

On the Title Page, item [73], change

Assignee: Kyokuto Boeki Kaisha, Tokyo, Japan;
Tohoku Electric Power Co. Inc.,
Sendai, Japan "

to  Assignee: Kyokuto Boeki Kaisha, Ltd., Tokyo, Japan;
Tohoku Electric Power Co., Inc.,
Sendai, Japan--

Signed and Sealed this

Third Day of June, 1997

*Attest:*

BRUCE LEHMAN

*Attesting Officer*     Commissioner of Patents and Trademarks